(12) United States Patent
Hamilton et al.

(10) Patent No.: US 9,966,732 B2
(45) Date of Patent: May 8, 2018

(54) OPTICAL AMPLIFIER

(71) Applicant: SOLUS TECHNOLOGIES LIMITED, Glasgow, Central Scotland (GB)

(72) Inventors: Craig James Hamilton, Central Scotland (GB); Graeme Peter Alexander Malcolm, Central Scotland (GB)

(73) Assignee: SOLUS TECHNOLOGIES LIMITED, Glasgow (GB)

(*) Notice: Subject to any disclaimer, the term of this patent is extended or adjusted under 35 U.S.C. 154(b) by 0 days. days.

(21) Appl. No.: 15/306,820

(22) PCT Filed: Apr. 28, 2015

(86) PCT No.: PCT/GB2015/051232
§ 371 (c)(1),
(2) Date: Oct. 26, 2016

(87) PCT Pub. No.: WO2015/166229
PCT Pub. Date: Nov. 5, 2015

(65) Prior Publication Data
US 2017/0047707 A1 Feb. 16, 2017

(30) Foreign Application Priority Data
Apr. 28, 2014 (GB) .................... 1407462.9

(51) Int. Cl.
H01S 3/00 (2006.01)
H01S 5/04 (2006.01)
(Continued)

(52) U.S. Cl.
CPC .......... H01S 5/041 (2013.01); H01S 5/02484 (2013.01); H01S 5/183 (2013.01);
(Continued)

(58) Field of Classification Search
CPC ...... H01S 5/02484; H01S 5/041; H01S 5/187; H01S 5/34; H01S 5/50; H01S 5/18361
(Continued)

(56) References Cited

U.S. PATENT DOCUMENTS

2004/0190567 A1* 9/2004 Lutgen .................. H01S 3/1118
372/25
2006/0268398 A1 11/2006 Cole et al.
(Continued)

FOREIGN PATENT DOCUMENTS

WO WO 2008/045810 A1 4/2008
WO WO 2013/152447 A2 10/2013

OTHER PUBLICATIONS

Bjorlin et al., "Carrier-Confined Vertical-Cavity Semiconductor Optical Amplifiers for Higher Gain and Efficiency," IEEE Journal of Selected Topics in Quantum Electronics, vol. 9, No. 5, Sep./Oct. 2003, New Jersey, pp. 1374-1385 (ISSN: 1077-260X).
(Continued)

Primary Examiner — Mark Hellner
(74) Attorney, Agent, or Firm — Nixon & Vanderhye P.C.

(57) ABSTRACT

An optical amplifier is described. The optical amplifier (1) comprises a semiconductor disk gain medium (2) including at least one quantum well layer (9) and a pump field source (17) for generating an optical pump field (3) for the semiconductor disk gain medium. The optical amplifier acts to generate an output optical field (5) from an input optical field (4) received by the optical amplifier and arranged to be incident upon the semiconductor disk gain medium. Employing a semiconductor disk gain medium within the optical amplifier allows it to be optically pumped and thus provided for increased stability and beam quality of the output optical field while allowing for the design of optical amplifiers which can operate across a broad range of wave-
(Continued)

lengths. The optical amplifier may be employed with continuous wave or pulsed input optical fields.

15 Claims, 4 Drawing Sheets

(51) Int. Cl.
    *H01S 5/024*     (2006.01)
    *H01S 5/183*     (2006.01)
    *H01S 5/50*      (2006.01)
    *H01S 5/187*     (2006.01)
    *H01S 5/34*      (2006.01)
(52) U.S. Cl.
    CPC .......... *H01S 5/187* (2013.01); *H01S 5/18361* (2013.01); *H01S 5/34* (2013.01); *H01S 5/50* (2013.01)
(58) Field of Classification Search
    USPC ........................................ 356/344
    See application file for complete search history.

(56) References Cited

U.S. PATENT DOCUMENTS

| | | | |
|---|---|---|---|
| 2009/0290606 A1* | 11/2009 | Chilla | B82Y 20/00 372/18 |
| 2011/0150013 A1* | 6/2011 | Spinelli | H01S 3/042 372/18 |
| 2013/0064262 A1* | 3/2013 | Kopf | H01S 3/0612 372/45.013 |

OTHER PUBLICATIONS

Calvez et al., "1.3 μm GaInNAs optically-pumped vertical cavity semiconductor optical amplifier," Electronics Letters, IIE Stevenage GB, vol. 39, No. 1, Jan. 9, 2003, pp. 100-102 (XP006019586).

R. Raj, "Novel application of optically pumped vertical cavity surface emitting laser: fast amplifying optical switch," Journal de Physique III, Les Editions de Physique 1994, vol. 4, No. 12, Dec. 1994, Paris, France, pp. 2371-2378 (XP000491698).

* cited by examiner

OPTICAL AMPLIFIER

This application is the U.S. national phase of International Application No. PCT/GB2015/051232 filed 28 Apr. 2015, which designated the U.S. and claims priority to GB Patent Application No. 1407462.9 filed 28 Apr. 2014, the entire contents of each of which are hereby incorporated by reference.

The present invention relates to the field of optical amplifiers and in particular to an optical amplifier based on a semiconductor disk gain medium.

BACKGROUND TO THE INVENTION

Within the present application the term semiconductor disk gain medium refers to the gain medium known in the field of Semiconductor Disk Lasers (SDLs). It is noted that SDLs are also known in the art as Vertical External Cavity Emitting Lasers (VECSELs) or Optically Pumped Semiconductor Lasers (OPSLs). Therefore the term semiconductor disk gain medium when used throughout the present description is used also to refer to the gain medium of each of these systems.

The term "ultra short" pulses as used within the following description refers to pulses having a duration from about 100 picoseconds (ps) down to a few femtoseconds (fs).

An optical amplifier is a device that amplifies an input optical field directly, without the need to first convert the input optical field into an electrical signal. A number of different forms of optical amplifier are known in the art, some of which are described briefly below.

One form of optical amplifier known in the art is a Doped Fibre Amplifier (DFA). These optical amplifiers employ a doped optical fibre as a gain medium to amplify the input optical field. In practice, the optical field to be amplified and a pump field are multiplexed into the doped fibre, and the optical field is then amplified through interaction with the doping ions. The most common example of DFA is an Erbium Doped Fibre Amplifier (EDFA) although Thulium, Praseodymium and Ytterbium doped fibre amplifiers have also been successfully demonstrated. DFAs are however relatively expensive systems to produce. Furthermore, due to the design restrictions it is not possible to employ a DFA to amplify an input optical field having a wavelength less than 1 µm.

Alternative optical amplifiers known in the art are those based on solid state crystals. Optical amplifiers based on Ti Sapphire crystals pumped with a 514 to 532 nm wavelength source are capable of amplifying an input optical field having a wavelength less than 1 µm. Two different designs exist for such amplifiers: regenerative amplifiers and multi-pass amplifiers. In a regenerative amplifier the input optical field is amplified within a resonator. However, unlike normal laser resonators that comprise a partially reflective mirror that functions as an output coupler, the amplifier resonator comprises high-speed optical switches that insert the optical field into the resonator and then extract the pulse out of the resonator at the moment when it has been appropriately amplified. In the multi-pass amplifier design, there are no optical switches. Instead, mirrors guide the input optical field a fixed number of times (two or more) through the solid state crystal with slightly different directions. These types of optical amplifiers generally require relatively large footprints and are also relatively expensive to produce.

Optical Parametric Amplifiers (OPAs) employ the nonlinear properties of crystal materials to provide the means of amplification to an input optical field. Here, the input optical field propagates through the nonlinear crystal together with a pump field of shorter wavelength. Photons from pump field are then converted into (lower-energy) signal photons (which act to amplify the input optical field) and the same number of so-called idler photons. The photon energy of the idler wave is the difference between the photon energies of the pump and signal waves. As the pump energy is fully converted into energy of signal and idler beams, the crystal material is not heated by this process. OPAs are however complex devices, that require relatively large footprints and are relatively expensive to produce.

A range of semiconductor based optical amplifiers (SOAs) have also been developed. Examples of semiconductor optical amplifiers are those made from group III-V compound semiconductors e.g. GaAs/AlGaAs, InP/InGaAs, InP/InGaAsP and InP/InAlGaAs Other direct band gap semiconductors can equally well be employed, such as group II-VI compound semiconductors.

More recently, it has proved advantageous for such gain mediums to be provided with a tapered profile. For example GaAs based tapered amplifiers have been used for the amplification of input optical fields (15 mW and 30 mW and wavelengths between 755 nm and 1064 nm) to provide nearly diffraction limited power values of up to 2 W.

A further addition to the SOA family is the vertical-cavity SOA (VCSOA). These devices are similar in structure to, and share many features with, vertical-cavity surface-emitting lasers (VCSELs). The major difference when comparing VCSOAs and VCSELs is the reduced mirror reflectivity employed within the amplifier cavity. Given their vertical-cavity geometry, VCSOAs have the advantage that they are resonant cavity optical amplifiers that operate with the input and output optical fields entering and exiting normal to the wafer surface.

The above described SOAs are all relatively compact and cheaper to produce when compared with the previously described DFAs, solid state crystal amplifiers and OPAs. However, with SOAs it can prove difficult to couple the signal field into the gain medium. In addition, the use of electrical pumping and the inherent nonlinearity of the semiconductor materials can lead to pulse distortion and even to the breakup of the output field pulses. As a result the SOAs known in the art are not found to provide long term stability characteristics on the amplified output field and often generate outputs that are of low beam quality.

It is therefore an object of an aspect of the present invention to obviate or at least mitigate the foregoing disadvantages of the optical amplifiers known in the art.

SUMMARY OF THE INVENTION

According to a first aspect of the present invention there is provided an optical amplifier comprising:
a semiconductor disk gain medium that includes at least one quantum well layer; and
a pump field source for generating an optical pump field for the semiconductor disk gain medium
wherein
the optical amplifier generates an output optical field from an input optical field received by the optical amplifier and arranged to be incident upon the semiconductor disk gain medium.

Employing a semiconductor disk gain medium within the optical amplifier allows it to be optically pumped and thus provided for increased stability of the device and for an output optical field of increased beam quality. The incorporation of the semiconductor disk gain medium also means that the wavelength of the input optical field that can be amplified is dictated primarily by the form of the wafer structures of the semiconductor disk gain medium. This allows the design of optical amplifiers across a broad range of wavelengths, and in particular it allows for the amplification of wavelengths below 1 μm.

Preferably the semiconductor disk gain medium is mounted on a reflector. Most preferably the reflector comprises a Distributed Bragg Reflector (DBR).

Preferably the pump field source comprises a diode laser. This is advantageous in making the optical amplifiers compact and highly cost effective to produce.

The input optical field may comprise a continuous wave optical field.

Alternatively, the input optical field may comprise a pulsed optical field.

Most preferably the optical amplifier comprises one or more steering optics arranged to form an input optical field resonator that provides a means for the input optical field to be incident upon the semiconductor disk gain medium on two or more occasions. By arranging for the input optical field to be incident upon the semiconductor disk gain medium on two or more occasions increases the level of amplification experienced by the input optical field.

Most preferably the input optical field resonator is arranged to ensure that the time between occasions where the pulse of the incident optical filed are incident upon the semiconductor disk gain medium is shorter than an upper state lifetime of the gain medium. This arrangement ensures that gain is efficiently extracted from the optical amplifier. As the upper state lifetime of a semiconductor disk gain medium is typically ~5 ns the above condition is satisfied by making the overall length of the input optical field resonator less than ~1.5 m e.g. 15 cm.

Optionally, gain saturation within the semiconductor disk gain medium can be employed to compress the pulses of the input optical field.

The one or more steering optics may comprise a parabolic mirror. Alternatively, or in addition the one or more steering optics may comprise one or more flat mirrors. Alternatively, or in addition the one or more steering optics may comprise one or more prisms.

According to a second aspect of the present invention there is provided a method of amplifying an input optical field the method comprising:

optically pumping a semiconductor disk gain medium including at least one quantum well layer, arranging for the input optical field to be incident upon the optically pumped semiconductor disk gain medium.

The method preferably comprises arranging for the input optical field to be incident upon the optically pumped semiconductor disk gain medium on two or more occasions.

The input optical field may comprise a continuous wave optical field.

Alternatively, the input optical field may comprise a pulsed optical field.

Most preferably the time between the two or more occasions where the pulses of the input optical field are incident upon the pumped semiconductor disk gain medium is shorter than an upper state lifetime of the gain medium. This arrangement ensures that gain is efficiently extracted from the optical amplifier.

The method may further comprise employing gain saturation within the semiconductor disk gain medium to compress the pulses of the input optical field.

Embodiments of the second aspect of the invention may comprise features to implement the preferred or optional features of the first aspect of the invention or vice versa.

According to a third aspect of the present invention there is provided an optical amplifier comprising:

a semiconductor disk gain medium including at least one quantum well layer; and a pump field source for generating an optical pump field for the semiconductor disk gain medium wherein the optical amplifier is arranged receive and amplify an input optical field to generate an output optical field.

Embodiments of the third aspect of the invention may comprise features to implement the preferred or optional features of the first or second aspects of the invention or vice versa.

BRIEF DESCRIPTION OF THE DRAWINGS

There will now be described, by way of example only, various embodiments of the invention with reference to the drawings, of which.

Figure 1:
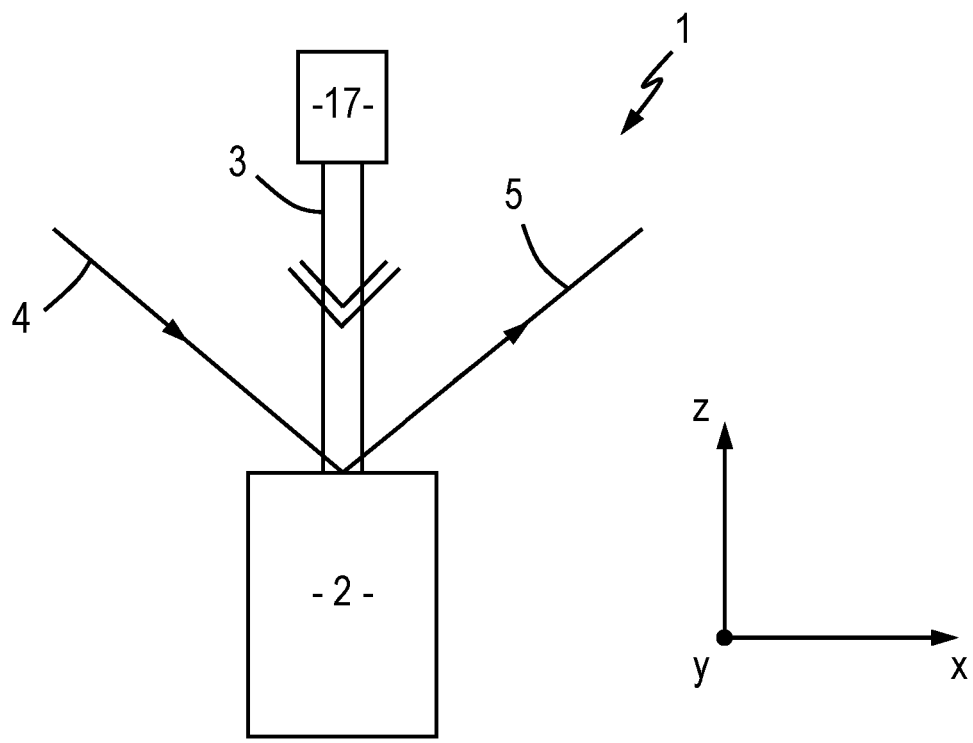
FIG. 1 presents a schematic representation of an optical amplifier in accordance with an embodiment of the present invention.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION OF PREFERRED EMBODIMENTS

An explanation of the present invention will now be described with reference to FIG. 1. In particular, FIG. 1 presents a schematic representation of an optical amplifier 1 in accordance with an embodiment of the present invention is shown. For clarity of understanding axes are provided within this figure.

The optical amplifier 1 can be seen to comprise a semiconductor disk gain medium 2 further details of which are provided below with reference to FIGS. 2 and 3. An optical pump field, depicted generally by reference numeral 3 is incident upon the semiconductor disk gain medium 2. In the presently described embodiment, the optical pump field 3 is substantially perpendicular to the front surface of the semiconductor disk gain medium 2. An input optical field 4 is also incident upon the semiconductor disk gain medium 2. In the presently described embodiment the input optical field 4 is incident upon the semiconductor disk gain medium 2 at an angle of approximately −45° to the optical pump field 3.

The optical pump field 3 acts to excite the gain medium 9 of the semiconductor disk gain medium 2. When the input optical field 4 is incident upon the excited gain medium 9 stimulated emission occurs. This results in amplification of the input optical field 4 and thus the generation of an output optical field 5. In the presently described embodiment the output optical field 5 propagates at an angle of approximately +45° to the optical pump field 3 due to reflection off of the semiconductor disk gain medium 2.

In the embodiment described with reference to FIG. 1 the optical pump field 3, the input optical field 4 and the output optical field 5 all propagate within the plane defined by the x and z axes. It will however be appreciated by the skilled reader that one or more of these optical fields may propagate in one or more alternative planes.

Figure 2:
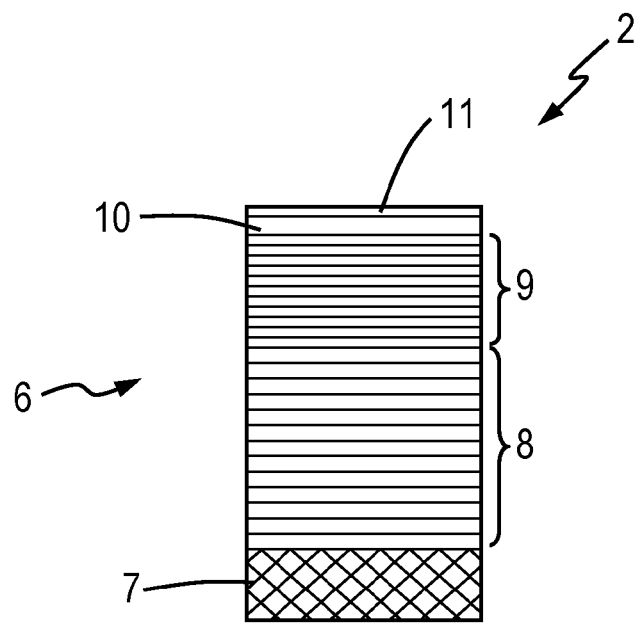
FIG. 2 presents a schematic representation of a semiconductor disk gain medium employed by the optical amplifier of FIG. 1.

A schematic representation of the semiconductor disk gain medium 2 is presented in FIG. 2. The semiconductor disk gain medium 2 can be seen to comprise a wafer structure 6 that is grown by a metal-organic chemical vapour deposition (MOCVD) technique on a GaAs substrate 7. The deposition of the wafer structure may be achieved by alternative techniques known in the art e.g. molecular beam epitaxy (MBE) deposition techniques. The wafer structure 6 comprises a distributed Bragg reflector (DBR) region 8, a gain medium 9, a carrier confinement potential barrier 10 and an oxidation prevention layer 11.

As is appreciated by those skilled in the art, there are many variations of the wafer structures 6 incorporated within semiconductor disk gain mediums and the present invention is not limited to use with any particular DBR 8 or gain medium 9 structure. In general, the gain medium 9 will comprise multiple quantum wells equally spaced between half-wave structures that allow the semiconductor disk gain medium 2 to be optically pumped at a convenient pump wavelength while the DBR 8 generally comprise multiple pairs of quarter-wave layers that exhibit high reflectivities at the wavelength of the input optical field 4.

By way of example only, the presently described embodiments comprise a gain medium 9 comprising InGaAs quantum wells equally spaced between half-wave GaAs structures that allow the semiconductor disk gain medium 2 to be optically pumped at 808 nm while generating gain at 980 nm.

The first DBR region 8 comprises thirty pairs of AlAs—GaAs quarter-wave layers that produce a reflectivity greater than 99.9% centred at 980 nm. The carrier confinement potential barrier 10 comprises a single wavelength-thick $Al_{0.3}Ga_{0.7}As$ layer. The oxidation prevention layer 11 may comprise a thin GaAs cap.

Alternative gain mediums known to those skilled in the art that may alternatively be used include alternative gallium arsenide (GaAs) structures capable of gain at wavelengths between 670 nm and 1300 nm; Indium Phosphide (InP) structures capable of generating gain at wavelengths between 1350 nm and 1600 nm; and Gallium Antimonide (GaSb) structures capable of generating gain at 1800 nm and 2700 nm. These gain mediums may be based on quantum wells or quantum dots, as known to those skilled in the art.

Figure 3:
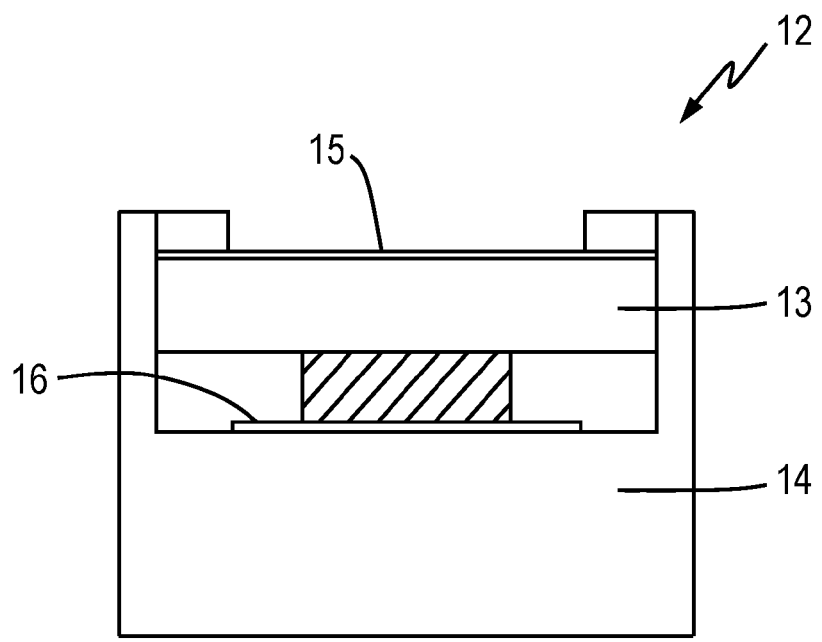
FIG. 3 present a schematic representation of a cooling apparatus employed in conjunction with the semiconductor disk gain medium of FIG. 2.

FIG. 3 presents further detail of a cooling apparatus 12 employed in order to improve the operating characteristics of the semiconductor disk gain medium 2. In particular, the cooling apparatus 12 comprises a heat spreader 13 and a standard thermoelectric or water cooler 14. The heat spreader 13 comprises a single diamond crystal that comprises an external, wedged face 15. A high performance anti-reflection coating may be deposited on the surface of the wedged face 15.

The single diamond crystal heat spreader 13 is bonded by optical contacting with the wafer structure 6 so that the gain medium 9 is located between the heat spreader 13 and the DBR 8. The wafer structure 6 and heat spreader 13 are then fixed on top of a layer of indium foil 16 onto the thermoelectric or water cooler 14.

The optical pump field 3 for pumping the semiconductor disk gain medium 2 may be provided by a fibre coupled laser diode system 17. In the presently described embodiment the fibre coupled laser diode system 17 is configured to generate the CW optical pumping field 3 at 808 nm. A DILAS® M1F4S22-808 30C-SS2.1 is an example of one such suitable fibre coupled laser diode system 17. Pump optics may be employed so as to provide a means for controlling the size of the optical pump field 3 on the front surface of the semiconductor disk gain medium 2.

As can be seen from FIG. 1, the fibre coupled laser diode system 17 is arranged to pump the gain medium 9 at an angle suitable for providing a circular pump spot at the surface of the gain medium 9. It will be appreciated by the skilled reader that the present invention is not so limited and that the fibre coupled laser diode system 17 could provide an optical pump field 3 that is non-perpendicular to the semiconductor disk gain medium 2 so as to provide an elliptical pump spot at the surface of the gain medium 9.

Figure 4:
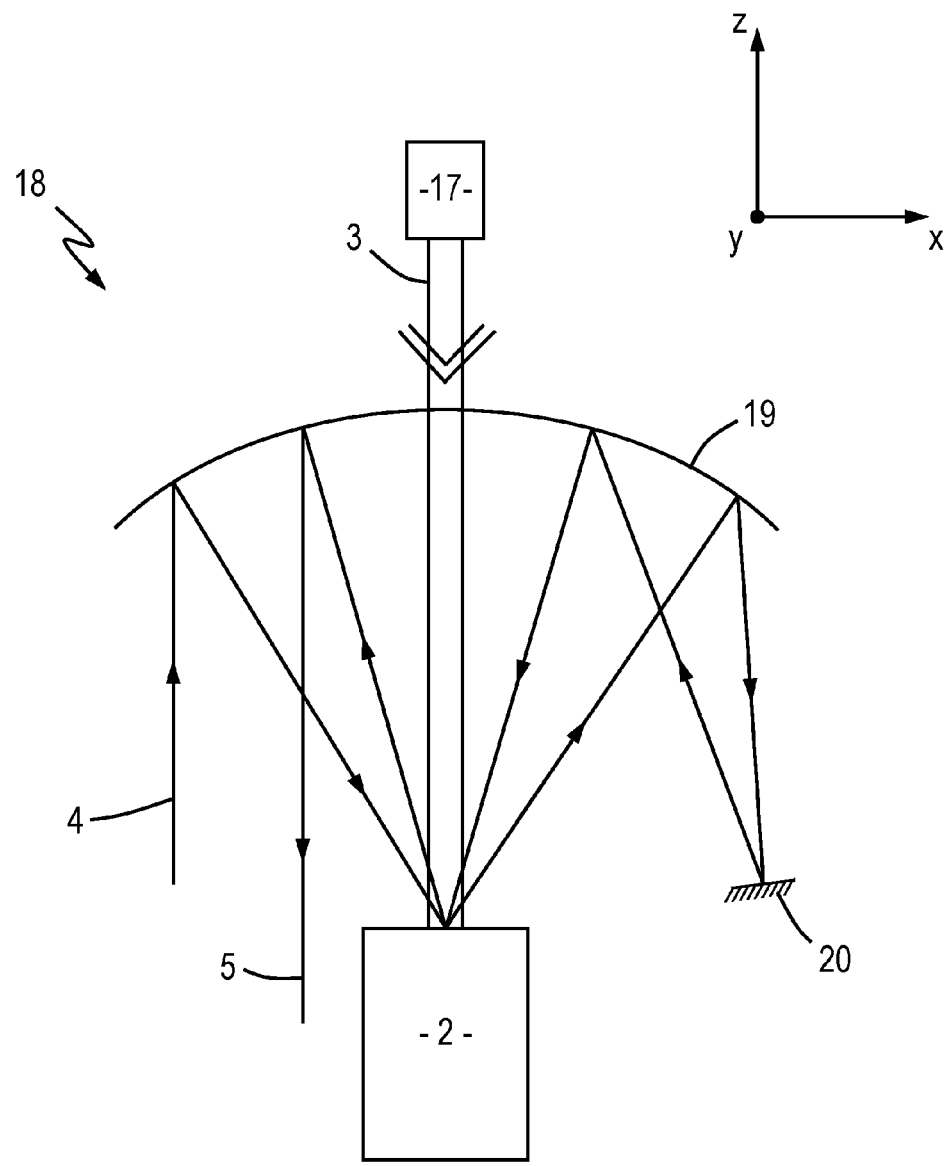
FIG. 4 presents a schematic representation of an optical amplifier in accordance with an alternative embodiment of the present invention.

FIG. 4 presents a schematic representation of an optical amplifier 18 in accordance with an alternative embodiment of the present invention. This embodiment shares a number of features in common with the optical amplifier described with reference to FIG. 1 and so like parts have been allocated common reference numerals accordingly. The optical amplifier 18 can again be seen to comprise a semiconductor disk gain medium 2 that is perpendicularly pumped by an optical pump field 3. In the presently described embodiment the optical pump field 3 propagates through a parabolic mirror 19 before arriving at the semiconductor disk gain medium 2.

The parabolic mirror 19 and a first steering mirror 20 act in combination to form a resonator for the input optical field 4. As can be seen from FIG. 4, the optical amplifier 18 receives the input optical field 4 via the parabolic mirror 19 which is arranged to reflect the input optical field 4 onto the front surface of the semiconductor disk gain medium 2. It is preferable for the parabolic mirror 19 to be arranged to provide good mode matching between the area of the optical pump field 3 and the input optical field 4 at the front surface of the semiconductor disk gain medium 2. With this configuration the input optical field 4 is then amplified by the gain medium 9 of the semiconductor disk gain medium 2, in a similar manner to that described above, and reflected back towards the parabolic mirror 19. The input optical field 4 is then reflected again by the parabolic mirror 19, this time towards the first steering mirror 20. The first steering mirror 20 is arranged to reflect the input optical field 4 back through the optical amplifier 18 such that the further amplification of the input optical field 4 takes place. In this way the optical amplifier generates an output optical field 5 from the input optical field 4 that has been amplified twice by the semiconductor disk gain medium 2.

Figure 5:
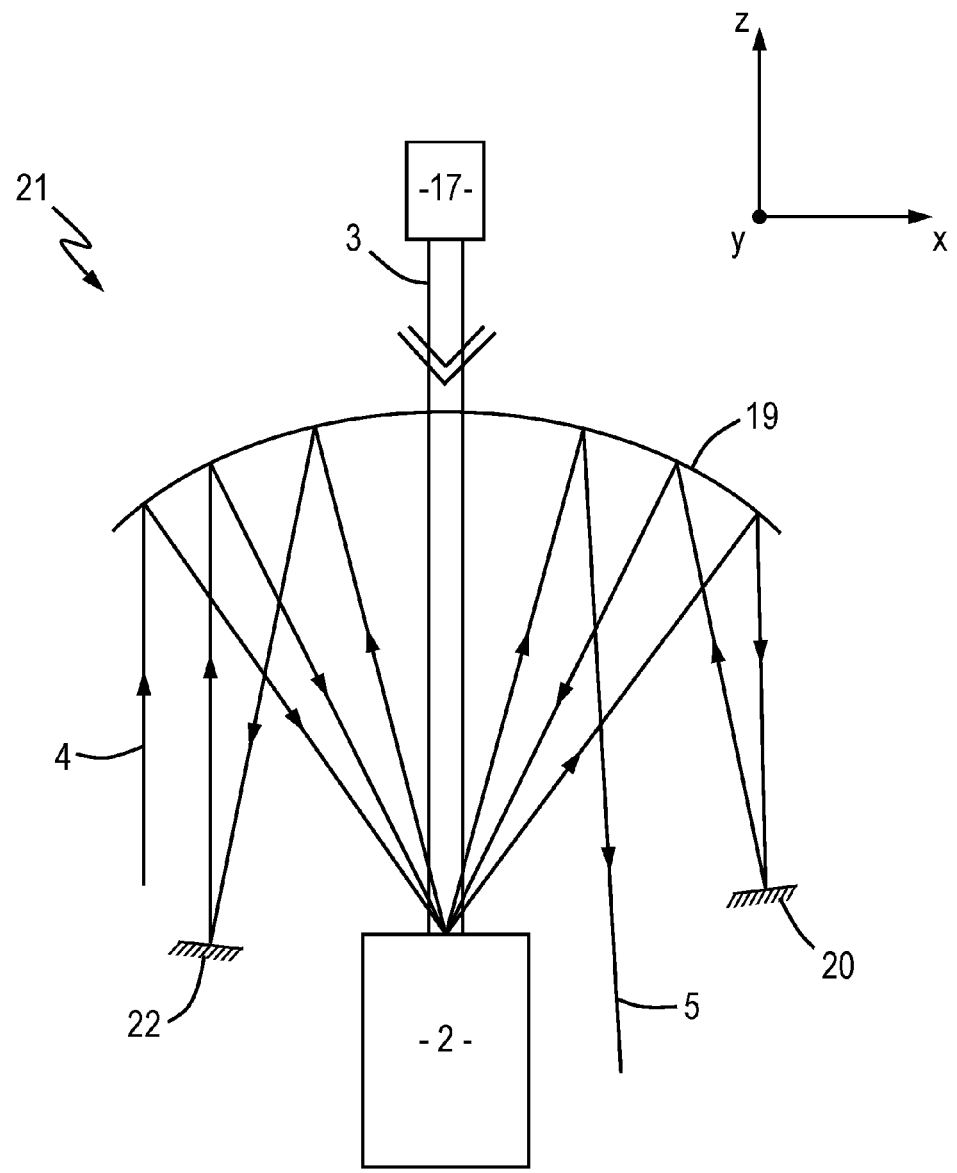
FIG. 5 presents a schematic representation of an optical amplifier in accordance with a yet further alternative embodiment of the present invention.

It will be appreciated by the skilled reader that by increasing the number of times the input optical field 4 propagates through the optical amplifier then the levels of amplification provided are also increased. For example, FIG. 5 presents a schematic representation of an optical amplifier 21 in accordance with a yet alternative embodiment of the present invention. The optical amplifier 21 can be seen to be similar to that described above with reference to FIG. 4. However, the presently described embodiment comprises a resonator for the input optical field 4 that includes a second steering mirror 22 arranged so as to pass the input optical field 4 back through the optical amplifier 21 for a third time.

In the embodiments described with reference to FIGS. 4 and 5 the optical pump field 3, the input optical field 4 and the output optical field 5 all propagate within the plane defined by the x and z axes. It will however be appreciated by the skilled reader that one or more of these optical fields may propagate in one or more alternative planes.

It will be appreciated that in further alternative embodiments alternative beam steering arrangements and thus resonator for the input optical field may be adopted in order to increase the number of times the input optical field passes through the optical amplifiers described herein e.g. additional steering mirrors may be incorporated; the arrangement of the steering mirrors may be altered such that the input optical field is reflected more than once from a beam steering mirror; and or the arrangement of the steering mirrors may be altered such that the input optical field propagates out of the plane defined by the x and y axis.

The above described optical amplifiers are capable of amplifying an input optical field output generated by a Ti:Sapphire laser, and having a power level of ~10 mW at wavelengths between 700 nm and 1 µm, to power levels over 2 W. It is anticipated that with further refinement of the configuration of the semiconductor disk gain medium power levels as high as 10 W may be achieved.

It will be appreciated by the skilled reader that gain within a semiconductor disk gain medium is achieved via the population inversion of the semiconductor carriers present within the gain medium. The inversion level is primarily set by the design of the semiconductor disk gain medium, the power and wavelength of the optical pump field, and the power of the input optical field. As the power of the input optical field increases or the power of the optical pump field decreases, the inversion level will reduce thereby causing gain saturation within the optical amplifier. Advantage can be taken of the effect of gain saturation in order to provide pulse compression, as well as amplification, of the input optical field.

The above described optical amplifiers are suitable for use with continuous wave or pulsed input optical fields. When employed with a pulsed input optical field it is preferable for the repetition rate of the input optical field through the optical amplifier to be below the upper-state lifetime of the semiconductor carriers located within the gain medium of the semiconductor disk gain medium (typically around 5 ns). This condition can be satisfied by making the overall length of the input optical field resonator less than ~1.5 m e.g. 15 cm. This arrangement ensures that amplification of the pulsed input optical field is achieved by the efficient extraction of energy from the gain medium.

The presently describe optical amplifiers exhibit several advantages over those systems known in the art. In particular the optical systems can be diode pumped making them compact and highly cost effective. Since the optical amplifiers are optically pumped rather than electrically pumped, the associated output field exhibits increased stability and beam quality when compared with those from SOAs known in the art.

The incorporation of a semiconductor disk gain medium means that the wavelengths of the input optical field that can be amplified is simply dictated by the form of the wafer structures. This has resulted in the described optical amplifiers being able to be designed to amplify a broad range of wavelengths, and in particular allows for amplification of wavelengths below 1 µm.

It will be appreciated that a number of alternatives may be incorporated into the above described embodiments. For example the structure of the semiconductor disk gain medium 2 may be varied so as to provide amplification at alternative wavelengths as required by the particular application.

The heat spreader may alternatively comprise materials other than single diamond crystal as long as the material employed exhibits the required heat spreading properties. Sapphire ($Al_2O_3$) and silicon carbide (SiC) are examples of alternative materials that may be employed to produce the heat spreader.

An optical amplifier is described. The optical amplifier comprises a semiconductor disk gain medium including at least one quantum well layer and a pump field source for generating an optical pump field for the semiconductor disk gain medium. The optical amplifier acts to generate an output optical field from an input optical field received by the optical amplifier and arranged to be incident upon the semiconductor disk gain medium. Employing a semiconductor disk gain medium within the optical amplifier allows it to be optically pumped and thus provided for increased stability and beam quality of the output optical field while allowing for the design of optical amplifiers which can operate across a broad range of wavelengths. The optical amplifier may be employed with continuous wave or pulsed input optical fields.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. An optical amplifier comprising:
   a semiconductor disk gain medium that includes at least one quantum well layer mounted on a reflector;
   a heat spreader bonded to the semiconductor disk gain medium to locate the semiconductor gain medium between the heat spreader and the reflector;
   a pump field source for generating an optical pump field for the semiconductor disk gain medium; and
   one or more steering optics arranged to form an input optical field resonator, wherein the optical amplifier generates an output optical field from an input optical field received by the input optical field resonator, the input optical field resonator providing a means for the input optical field to be incident upon the semiconductor disk gain medium on two or more occasions.

2. An optical amplifier as claimed in claim 1 wherein the reflector comprises a Distributed Bragg Reflector (DBR).

3. An optical amplifier as claimed in claim 1 wherein the pump field source comprises a diode laser.

4. An optical amplifier as claimed in claim 1 wherein the input optical field comprises a continuous wave optical field.

5. An optical amplifier as claimed in claim 1 wherein the input optical field comprises a pulsed optical field.

6. An optical amplifier as claimed in claim 1, wherein the input optical field resonator is arranged to ensure that the time between occasions where the pulse of the input optical field are incident upon the semiconductor disk gain medium is shorter than an upper state lifetime of the gain medium.

7. An optical amplifier as claimed in claim 5 wherein gain saturation within the semiconductor disk gain medium is employed to compress the pulses of the input optical field.

8. An optical amplifier as claimed in claim 1 wherein the one or more steering optics comprise a parabolic mirror.

9. An optical amplifier as claimed in claim 1 wherein the one or more steering optics comprise one or more flat mirrors.

10. An optical amplifier as claimed in claim 1 wherein the one or more steering optics comprise one or more prisms.

11. A method of amplifying an input optical field, the method comprising:
mounting a semiconductor disk gain medium including at least one quantum well layer on a reflector,
bonding a heat spreader to the semiconductor disk gain medium to locate the semiconductor gain medium between the heat spreader and the reflector,
optically pumping the semiconductor disk gain medium,
arranging for the input optical field to be incident upon the optically pumped semiconductor disk gain medium on two or more occasions.

12. A method of amplifying an input optical field as claimed in claim 11 wherein the input optical field comprises a continuous wave optical field.

13. A method of amplifying an input optical field as claimed in claim 11 wherein the input optical field comprises a pulsed optical field.

14. A method of amplifying an input optical field as claimed in claim 13, wherein the time between the two or more occasions where the pulses of the input optical field are incident upon the pumped semiconductor disk gain medium is shorter than an upper state lifetime of the gain medium.

15. A method of amplifying an input optical field as claimed in claim 13 wherein gain saturation within the semiconductor disk gain medium is employed to compress the pulses of the input optical field.

* * * * *